United States Patent
Nishiyama et al.

(10) Patent No.: US 8,395,383 B2
(45) Date of Patent: Mar. 12, 2013

(54) CURRENT SENSOR INCLUDING MAGNETIC DETECTING ELEMENT

(75) Inventors: Yoshihiro Nishiyama, Miyagi-Ken (JP); Masamichi Saito, Miyagi-Ken (JP); Akira Takahashi, Miyagi-Ken (JP); Yosuke Ide, Miyagi-Ken (JP); Hidekazu Kobayashi, Miyagi-Ken (JP); Masahiro Iizuka, Miyagi-Ken (JP)

(73) Assignee: Alps Green Devices Co., Ltd., Tokyo (JP)

( * ) Notice: Subject to any disclaimer, the term of this patent is extended or adjusted under 35 U.S.C. 154(b) by 262 days.

(21) Appl. No.: 13/037,231

(22) Filed: Feb. 28, 2011

(65) Prior Publication Data

US 2011/0221434 A1   Sep. 15, 2011

(30) Foreign Application Priority Data

Mar. 11, 2010 (JP) ................... 2010-054058

(51) Int. Cl.
*G01R 33/09* (2006.01)
(52) U.S. Cl. ........................................................ 324/252
(58) Field of Classification Search ............. 324/207.21, 324/252
See application file for complete search history.

(56) References Cited

FOREIGN PATENT DOCUMENTS

| JP | 60-69906 | 4/1985 |
|---|---|---|
| JP | 64-32712 | 2/1989 |
| JP | 2003-526083 | 9/2003 |
| JP | 2005-515667 | 5/2005 |
| WO | WO 99/45405 | 9/1999 |
| WO | WO 03/060538 | 7/2003 |

*Primary Examiner* — Bot Ledynh
(74) *Attorney, Agent, or Firm* — Beyer Law Group LLP (57) ABSTRACT

A current sensor includes a magnetic detecting element, a bridge circuit including a plurality of resistance elements, and a feedback coil placed adjacent to the magnetic detecting element and generating a cancelling magnetic field for cancelling the induced magnetic field based on the output from the bridge circuit. The wiring patterns forming the bridge circuit are routed so as not to intersect with each other when seen in a plan view. Only the resistance elements constituting each series circuit of the bridge circuit are connected to each other by the wiring pattern in an enclosed area which encloses each resistance element constituting the bridge circuit, and the wiring pattern branched from the wiring pattern is connected to the terminal which is installed in a quantity of only one, outside the enclosed area.

8 Claims, 5 Drawing Sheets

CURRENT SENSOR INCLUDING MAGNETIC DETECTING ELEMENT

CLAIM OF PRIORITY

The present invention contains subject matter related to Japanese Patent Application JP 2010-054058 filed in the Japanese Patent Office on Mar. 11, 2010, the entire contents of which being incorporated herein by reference.

BACKGROUND OF THE INVENTION

1. Field of the Invention

The present invention relates to a wiring pattern of a bridge circuit including a magnetic detecting element which is installed in, in particular, a current sensor.

2. Description of the Related Art

Figure 6:
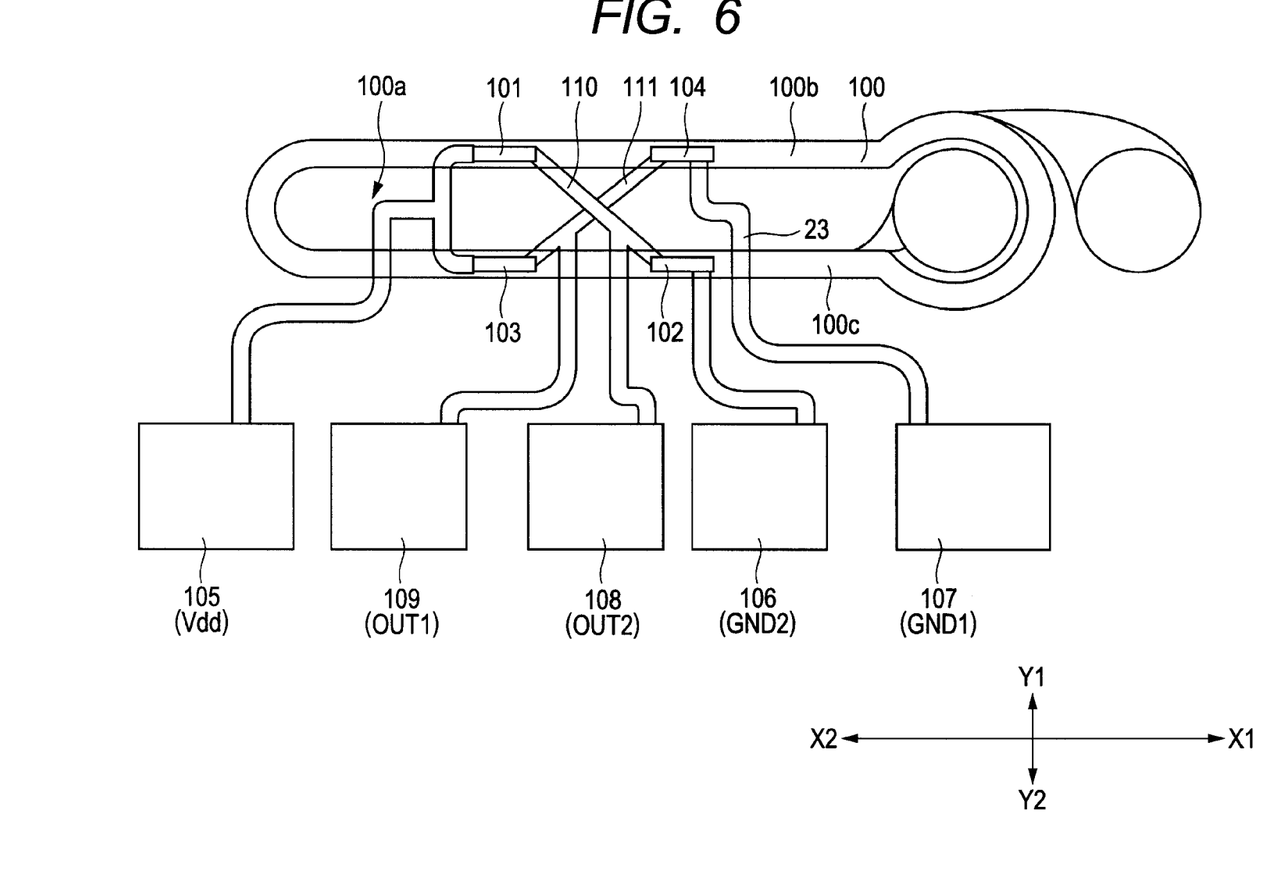
FIG. 6 is a plan view illustrating a current sensor according to a comparative embodiment for comparison with the present invention.

FIG. 6 is a planar structure of a current sensor according to a comparative embodiment for comparison with the present invention.

Reference numeral 100 indicates a feedback coil. Only an inner edge and an outer edge of the feedback coil 100 are illustrated. A plurality of resistance elements 101 to 104 is installed under the feedback coil 100. In FIG. 6, each of the resistance elements 101 to 104 is drawn as a see-through part.

The feedback coil 100 is wound in a spiral shape, and a spatial portion 100a is provided at the inner edge side. The feedback coil 100 is provided with a first magnetic field generating portion 100b which is positioned at a Y1 side, and a second magnetic field generating portion 100c which is positioned at a Y2 side. Below the first magnetic field generating portion 100b, two resistance elements 101 and 104 are disposed via an insulating layer (not illustrated) interposed therebetween. In addition, below the second magnetic field generating portion 100c, two resistance elements 102 and 103 are disposed via an insulating layer (not illustrated) interposed therebetween.

As shown in FIG. 6, a bridge circuit is formed by the four resistance elements 101 to 104. A wiring pattern connected to input terminal 105, ground terminals 106 and 107 and output terminals 108 and 109, and a wiring pattern connected between each element, are routed as shown in FIG. 6.

In the wiring patterns, wiring patterns 110 and 111 for connecting between the resistance elements 101 and 102 (103 and 104), which are connected in series to each other, intersect with each other via an insulating layer (not illustrated) therebetween at the position of the spatial portion 100a of the feedback coil 100.

However, since the insulating layer interposed between the wiring patterns 110 and 111 is formed not to have too large a thickness so as to magnetically couple the feedback coil 100 and the resistance elements 101 to 104, there is a concern about the insulation properties between the intersected wiring patterns 110 and 111. In addition, since the wiring patterns 110 and 111 should be formed at another level while the insulating layer is interposed therebetween, there is a problem that a manufacturing process becomes longer. Further, a parasitic capacitance is also generated between the intersected wiring patterns 110 and 111. Accordingly, there is a problem that a stable electric characteristics are not obtained.

In the invention disclosed in PCT Japanese Translation Patent Publication No. 2005-515667, wiring patterns constituting a bridge circuit do not interset with each other, but an inner region between resistance elements configuring the bridge circuit is not used as a routing region of the wiring pattern. For this reason, it is difficult to effectively route the wiring patterns in a narrow region. Moreover, the invention disclosed in PCT Japanese Translation Patent Publication No. 2005-515667 is not intended for use with a spin valve element.

PCT Japanese Translation Patent Publication No. 2003-526083, Japanese Unexamined Patent Application Publication No. 60-69906, and Patent Document 4: Japanese Unexamined Patent Application Publication No. 64-32712 are examples of related art.

SUMMARY OF THE INVENTION

Accordingly, the present invention is made in order to solve the above problems of the related arts, and, in particular, an object of the present invention is to provide a current sensor including a magnetic detecting element which can prevent short circuit between wiring patterns and effectively route the wiring patterns in a narrow region.

According to an aspect of the present invention, there is provided a current sensor including: a magnetic detecting element, of which a resistance value is varied by application of an induced magnetic field from a current to be measured; a bridge circuit including a plurality of resistance elements having the magnetic detecting element, and connected to an input terminal, a ground terminal, and an output terminal; and a feedback coil placed adjacent to the magnetic detecting element, and generating a cancelling magnetic field for cancelling the induced magnetic field based on an output from the bridge circuit, wherein wiring patterns forming the bridge circuit are routed so as not to intersect with each other when seen in plan view; one of the input terminal and the ground terminal is installed in a quantity of only one, and the other is installed in a quantity of two; only the resistance elements constituting each series circuit of the bridge circuit are connected to each other by the wiring pattern in an enclosed area which encloses each resistance element constituting the bridge circuit, and the wiring pattern branched from the wiring pattern is connected to the terminal which is installed in a quantity of only one, outside the enclosed area; and the wiring pattern connected to the terminals which are provided in a quantity of two, and the output terminal, is installed outside the enclosed area.

Accordingly, it is possible to prevent the wiring patterns from being short-circuited, and suppress the generation of a parasitic capacitance. In addition, it is possible to effectively route the wiring patterns in a narrow area.

According to the present invention, it is desirable that among the plurality of wiring patterns connected between each resistance element and each terminal, the wiring pattern with a short length dimension is formed to have a narrow width, and the wiring pattern with a long length dimension is formed to have a wide width. Accordingly, it is possible to appropriately set the output from the first output terminal and the second output terminal which constitute the bridge circuit, to a midpoint potential in a non-magnetic field state (including a state in which an induced magnetic field is cancelled by a cancelling magnetic field).

In addition, according to the present invention, it is desirable that each magnetic detecting element is a magneto-resistance effect element exerting a magneto-resistance effect on an external magnetic field; the magnetic detecting elements are installed in a plurality, in which each magnetic detecting element is placed opposite to a magnetic field generating portion of the feedback coil which generates the cancelling magnetic field in the same direction; and the fixed magnetic layer constituting each magnetic detecting element is magnetized/fixed in the same direction. With the routing configuration of the wiring patterns according to the present invention, the fixed magnetic layer of the plurality of magnetic detecting elements can be magnetized/fixed in the same direction. In addition, since the plurality of magnetic detecting elements can be formed in the same layer configuration by the same process, a manufacturing process can be simplified, and manufacturing costs can be also reduced. In addition, it is possible to enhance detection precision.

According to the present invention, it is desirable that the magnetic detecting element includes a multilayer film having at least a fixed magnetic layer, a nonmagnetic material layer, and a free magnetic layer which are deposited in this order, and an electrode layer connected to the wiring patterns to supply a current to the multilayer film.

In addition, according to the present invention, it is desirable that the electrode layer is placed at both sides of the multilayer film, and the wiring patterns are formed in the same layer.

Alternatively, according to the present invention, the electrode layer may be placed on and below the multilayer film, and the wiring patterns may be divided and formed in plural layers.

Further, according to the present invention, it is desirable that each terminal is arranged in series, and only one input or ground terminal is placed at the center of the terminals.

Moreover, according to the present invention, it is desirable that the resistance element has the magnetic detecting element and the fixed resistance element, and the magnetic detecting element and the fixed resistance element are placed opposite to the feedback coil.

With the current sensor including the magnetic detecting element according to the present invention, it is possible to prevent the wiring patterns from being short-circuited, and suppress the generation of a parasitic capacitance. In addition, it is possible to effectively route the wiring patterns in a narrow area.

DESCRIPTION OF THE PREFERRED EMBODIMENTS

Figure 1:
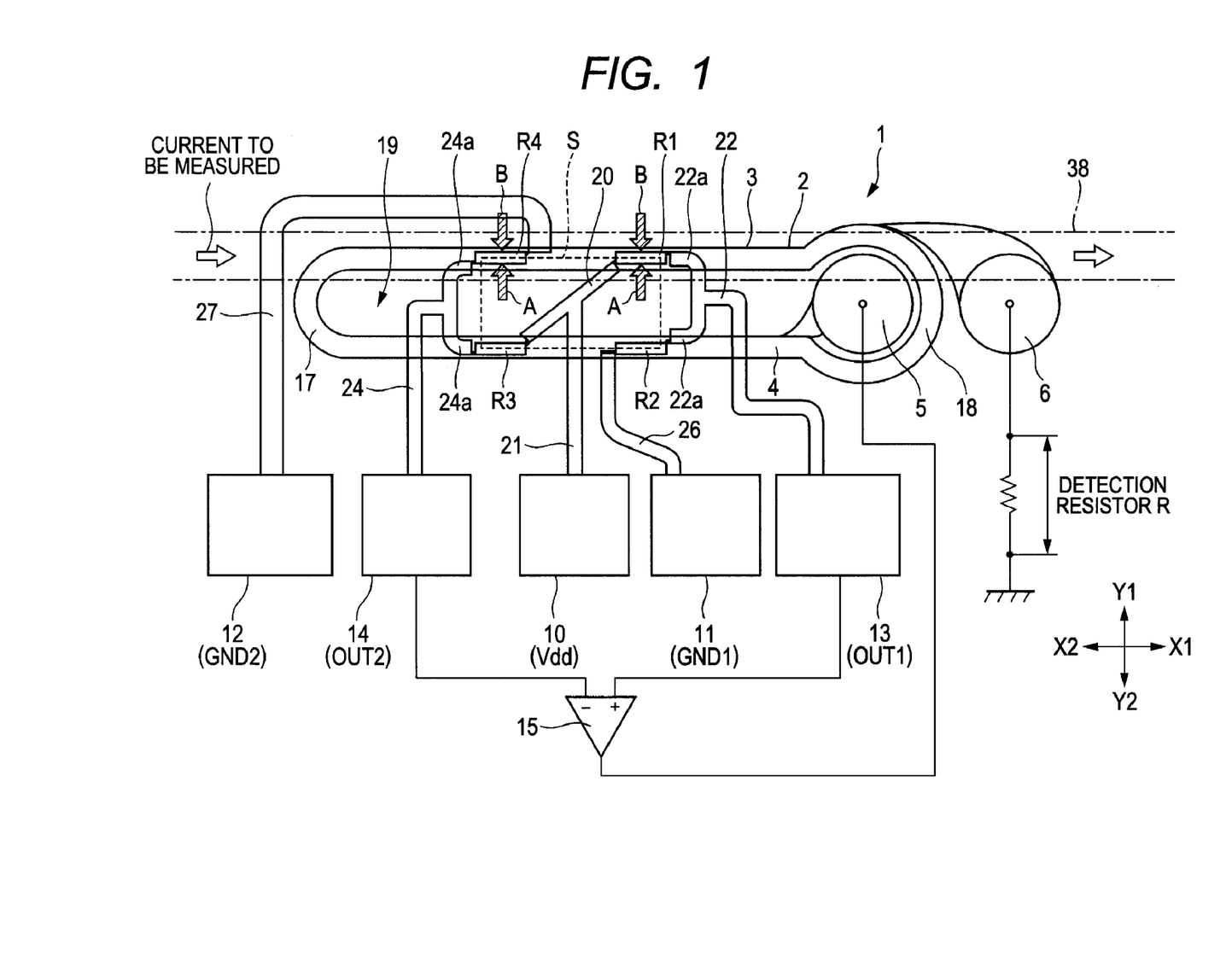
FIG. 1 is a plan view and a circuit diagram illustrating a shape of a current sensor including a magnetic detecting element according to the present embodiment.
Figure 2:
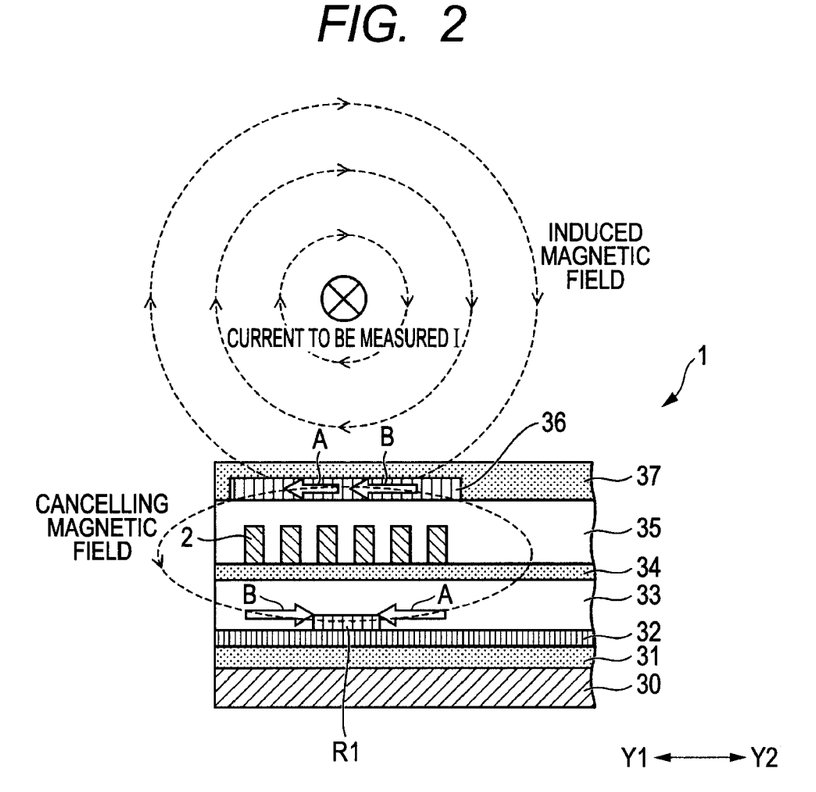
FIG. 2 is a partially enlarged longitudinal cross-sectional view illustrating the state in which a portion provided with the current sensor including the magnetic detecting element in FIG. 1 is cut in a thickness direction along a Y1-Y2 direction.
Figure 3:
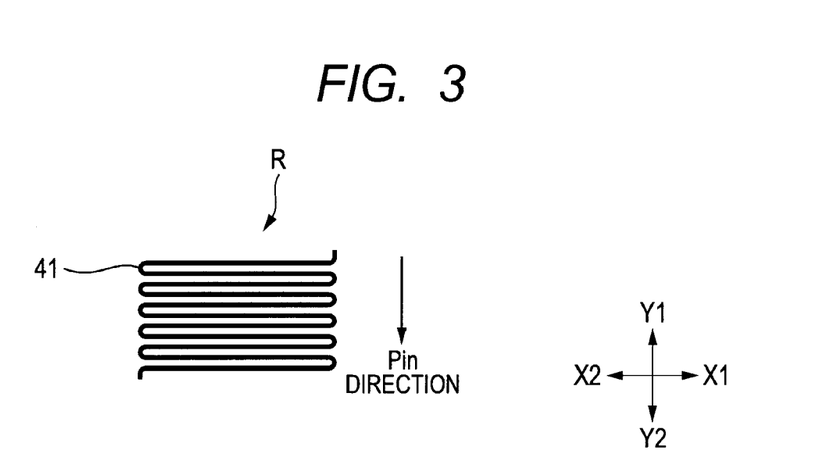
FIG. 3 is a plan view illustrating an example of a plane shape of a magnetic detecting element according to an embodiment.
Figure 4:
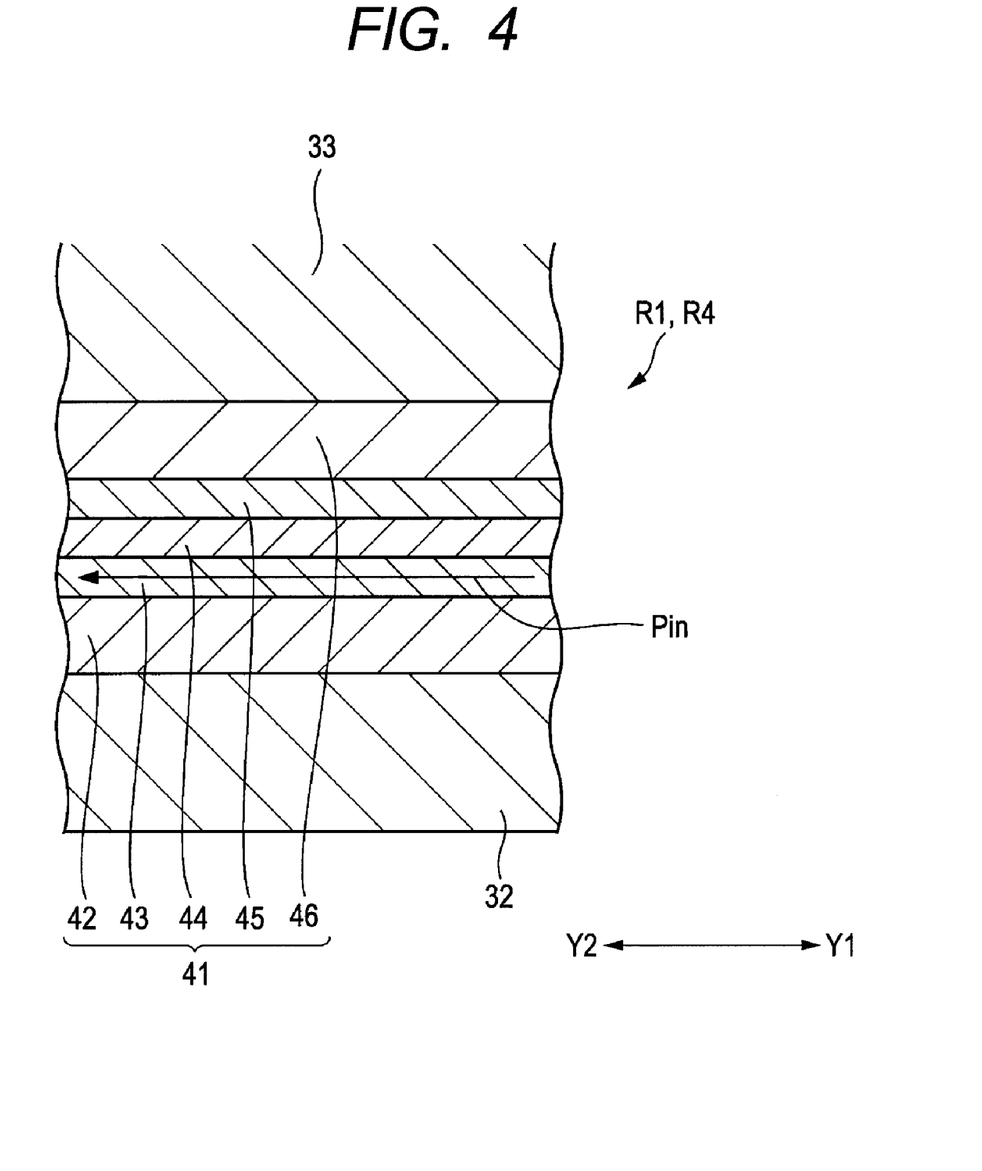
FIG. 4 is a fragmentary longitudinal cross-sectional view illustrating a magnetic detecting element according to the present embodiment which is cut in a thickness direction.
Figure 5:
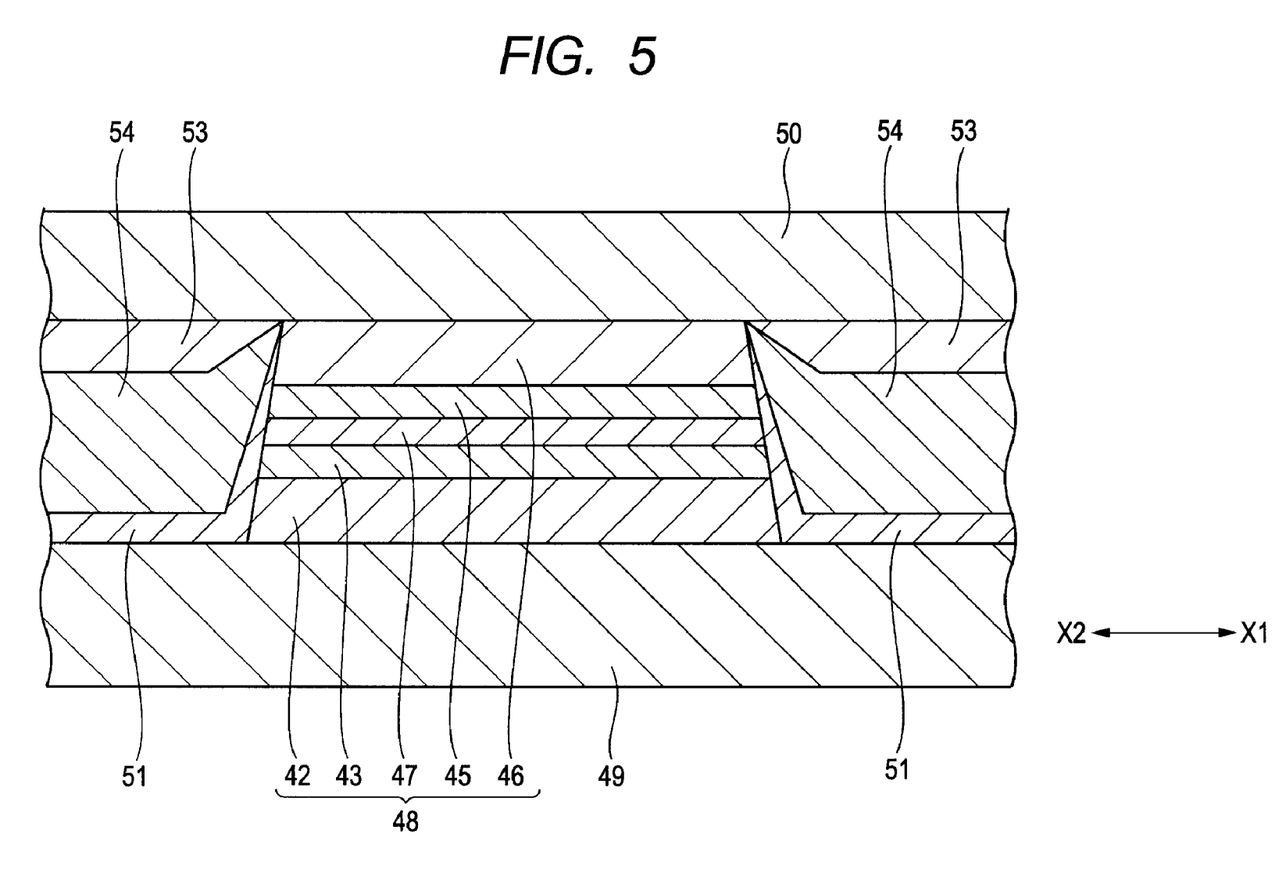
FIG. 5 is a fragmentary longitudinal cross-sectional view of a magnetic detecting element to illustrate a configuration different from that in FIG. 4.

FIG. 1 is a plan view and a circuit diagram illustrating a shape of a current sensor including a magnetic detecting element according to an embodiment. FIG. 2 is a partially enlarged longitudinal cross-sectional view illustrating the state in which a portion provided with the current sensor including the magnetic detecting element in FIG. 1 is cut in a thickness direction along a Y1-Y2 direction. FIG. 3 is a plan view illustrating an example of a plane shape of the magnetic detecting element according to the embodiment. FIG. 4 is a fragmentary longitudinal cross-sectional view illustrating the magnetic detecting element according to the embodiment which is cut in a thickness direction. FIG. 5 is a fragmentary longitudinal cross-sectional view of the magnetic detecting element to illustrate a configuration different from that in FIG. 4. In this instance, in FIG. 1, an insulating layer is not shown, and only an inner edge and an outer edge of a feedback coil 2 are shown. GMR elements R1 and R4 and fixed resistance elements R2 and R3 which are positioned under the feedback coil 2 are drawn as see-through parts.

As shown in FIG. 1, the current sensor 1 including the magnetic detecting element includes the feedback coil 2 and the plurality of resistance elements R1 to R4. Each of the resistance elements R1 to R4 is placed in the vicinity of the feedback coil 2 via an insulating layer (not illustrated) therebetween.

The feedback coil 2 is a plane coil shape having a first magnetic field generating portion 3 and a second magnetic field generating portion 4 which are extended in the shape of a strip in an X1-X2 direction, as shown in FIG. 1. The first magnetic field generating portion 3 and the second magnetic field generating portion 4 are opposed to each other at an interval in the Y1-Y2 direction shown in the drawing. The first magnetic field generating portion 3 and the second magnetic field generating portion 4 are connected to each other via connection portions 17 and 18. The connection portions 17 and 18 are formed in a curved shape, but are not limited thereto. A spatial portion 19 is enclosed and formed by the first magnetic field generating portion 3, the second magnetic field generating portion 4, and the connection portions 17 and 18.

As shown in FIG. 2, the feedback coil 2 is formed by winding coil pieces several times at a predetermined interval.

As shown in FIG. 1, two electrode pads 5 and 6 are connected to the feedback coil 2. The electrode pads 5 and 6 are circular, but are not limited to a specific shape.

As shown in FIG. 2, a thermal silicon oxide layer 31 serving as an insulating layer is formed on a substrate 30. In addition, an aluminum oxide layer 32 is formed on the thermal silicon oxide layer 31. For example, the aluminum oxide layer 32 can be formed as a film by sputtering or the like.

GMR elements R1 and R4 and fixed resistance elements R2 and R3 are formed on the aluminum oxide layer 32. FIG. 2 shows the GMR element R1.

The GMR elements R1 and R4 and the fixed resistance elements R2 and R3 are covered with, for example, a polyimide layer 33. The polyimide layer 33 may be formed by applying and curing a polyimide material. In addition, a silicon oxide layer 34 is formed on the polyimide layer 33. The silicon oxide layer 34 is formed as a film by, for example, sputtering or the like.

As shown in FIG. 2, the feedback coil 2 is formed on the silicon oxide layer 34. The feedback coil 2 may be formed in a roll shape by using photolithography technology after a coil material is formed as a film.

As shown in FIG. 2, the feedback coil 2 is covered with a polyimide layer 35. The polyimide layer 35 may be formed by applying and curing a polyimide material.

As shown in FIG. 2, a magnetic shield layer 36 is formed on the polyimide layer 35. The magnetic shield layer 36 is not limited to a specific material, but an amorphous magnetic material, permalloy-based magnetic material, or the like can be used.

As shown in FIG. 2, the magnetic shield layer 36 is covered with a silicon oxide layer 37. The silicon oxide layer 37 is formed as a film by sputtering or the like.

As shown in FIG. 1, the bridge circuit is formed by the GMR elements R1 and R4 and the fixed resistance elements R2 and R3.

As shown in FIG. 1, the GMR element R1 and the fixed resistance element R3 are connected to an input terminal (input pad) 10. There is one input terminal 10 in this embodiment.

In addition, the fixed resistance element R2 and the GMR element R4 are connected to separate ground terminals (ground pad) 11 and 12. Accordingly, there are two ground terminals 11 and 12 in this embodiment.

As shown in FIG. 1, a first output terminal (first output pad, OUT1) 13 is connected between the GMR element R1 and the fixed resistance element R2. In addition, a second output terminal (second output pad, OUT2) 14 is connected between the GMR element R4 and the fixed resistance element R3.

As shown in FIG. 1, an output side of the first output terminal 13 and an output side of the second output terminal 14 are connected to a differential amplifier 15.

An output side of the differential amplifier 15 is connected to an electrode pad 5 of the feedback coil 2.

With the current sensor shown in FIGS. 1 and 2, an induced magnetic field A generated by a current I to be measured which flows in a conductor 38 is detected by the bridge circuit having the GMR elements R1 and R4, and outputs from the two output terminals 13 and 14 provided in the bridge circuit are amplified by the differential amplifier 15, and then provided to the feedback coil 2 as a current (feedback current). The feedback current corresponds to a voltage difference due to the induced current. At that time, a cancelling magnetic field cancelling the induced current is generated at the feedback coil 2. When the induced magnetic field and the cancelling magnetic field are in an equilibrium state in which the induced magnetic field and the cancelling magnetic field are cancelled, the detection unit (detection resistor R; refer to FIG. 1) can measure a current to be measured based on the current flowing in the feedback coil 2.

The arrangement of the GMR elements R1 and R4 and the fixed resistance elements R2 and R3 according to the embodiment, and each wiring pattern thereof will now be described.

As shown in FIGS. 1 and 2, each of the GMR elements R1 and R4 is placed opposite to a bottom side of the first magnetic field generating portion 3 of the feedback coil 2. As shown in FIGS. 1 and 2, for example, the induced magnetic field A facing the Y1 direction acts on each of the GMR elements R1 and R4. The cancelling magnetic field B is generated from the feedback coil 2 in the Y2 direction to cancel the induced magnetic field A.

As shown in FIG. 1, each of the fixed resistance elements R2 and R3 is placed opposite to the bottom side of the second magnetic field generating portion 4 of the feedback coil 2.

As shown in FIG. 1, the first wiring pattern 20 is connected between the GMR element R1 and the fixed resistance elements R3. As shown in FIG. 1, the first wiring pattern 20 is positioned in an enclosed area S straightly enclosed between the resistance elements R1 to R4, when seen in plan view. An outer edge of the enclosed area is defined as a straight line passing through a center of each resistance element R1 and R4 in the widthwise direction. As shown in FIG. 1, the first wiring pattern 20 is obliquely formed when seen in the X1-X2 direction and the Y1-Y2 direction. In this instance, a portion of the first wiring pattern 20 may protrude from the enclosed area S.

As shown in FIG. 1, the second wiring pattern 21 is branched from the first wiring pattern 20. The second wiring pattern 21 extends from the internal position of the enclosed area S to the outside of the enclosed area S, and then is connected to the input terminal 10.

In addition, as shown in FIG. 1, a third wiring pattern 22 is connected between the GMR element R1 and the fixed resistance element R2. A front end 22a of the third wiring pattern 22 is branched, with one part being connected to the GMR element R1 and the other being connected to the fixed resistance element R2. The third wiring pattern 22 is installed outside the enclosed area S. Further, as shown in FIG. 1, the third wiring pattern 22 is connected to the first output terminal 13 which is installed outside the enclosed area S.

Moreover, as shown in FIG. 1, a fourth wiring pattern 24 is connected between the fixed resistance element R3 and the GMR element R4. A front end 24a of the fourth wiring pattern 24 is branched, with one part being connected to the GMR element R4 and the other being connected to the fixed resistance element R3. The fourth wiring pattern 24 is installed outside the enclosed area S. Further, as shown in FIG. 1, the fourth wiring pattern 24 is connected to the second output terminal 14 which is installed outside the enclosed area S.

In addition, as shown in FIG. 1, a fifth wiring pattern 26 is connected between the fixing resistance element R2 and the first ground terminal 11. Further, as shown in FIG. 1, a sixth wiring pattern 27 is connected between the GMR element R4 and the second ground terminal 12.

The fifth wiring pattern 26 and the sixth wiring pattern 27 are routed outside the enclosed area S.

As shown in FIG. 1, the respective terminals 10 to 14 are arranged in series at a predetermined interval in the X1-X2 direction. Accordingly, it is possible to easily perform wiring (electrical connection) with a signal processing circuit (IC) side. The input terminal 10 which is provided in a quantity of only one is arranged at the center position of the terminals 10 to 14.

As shown in FIG. 1, in this embodiment, the bridge circuit including the plurality of resistor terminals R1 to R4 and connected to the input terminal 10, the ground terminals 11 and 12, and the output terminals 13 and 14 is configured. As shown in FIG. 1, each of the wiring patterns 20, 21, 22, 24, 26 and 27 constituting the bridge circuit is routed so as not to intersect with each other when seen in plan view.

This can prevent the wiring patterns from being short-circuited, and suppress the generation of the parasitic capacitance.

The embodiment shown in FIG. 1 has the following features such that the wiring patterns are not intersected with each other when seen in plan view.

In the embodiment shown in FIG. 1, only one input terminal (input pad) 10 is installed, and two ground terminals (ground pad) 11 and 12 are installed.

The wiring pattern 20 is connected between the resistance elements R1 and R3 of one side constituting each series circuit of the bridge circuit in the enclosed area S which encloses the respective elements constituting the bridge circuit. The wiring pattern 21 branched from the wiring pattern 20 is connected to the input terminal 10 outside the enclosed area S.

In addition, each of the wiring patterns connected to the ground terminals 11 and 12 and the output terminals (output pad) 13 and 14 is installed outside the enclosed area S.

Accordingly, the wiring patterns can be routed in a simple and appropriate manner so as not to intersect with each other when seen in plan view. In addition, it is possible to effectively route the wiring patterns in a narrow area.

At that time, instead of the embodiment shown in FIG. 1, the ground terminal may be installed at the position of the input terminal 10, and the input terminal may be installed at the positions of the ground terminals 11 and 12. In this instance, the ground terminal has a quantity of one, and the input terminal has a quantity of two.

Each of the GMR elements R1 and R4 is formed of the same layer constitution. Each of the GMR elements R1 and R4 is formed of the structure shown in FIG. 4.

In FIG. 4, reference numeral 32 indicates the aluminum oxide layer shown in FIG. 2. As shown in FIG. 4, a multilayer film 41 is formed on the aluminum oxide layer 32. The multilayer film 41 has an antiferromagnetic layer 42, a fixed magnetic layer 43, a nonmagnetic conductive layer 44, a free magnetic layer 45, and a protective layer 46 which are deposited in this order from the bottom. At that time, the free magnetic layer 45, the nonmagnetic conductive layer 44, the fixed magnetic layer 43, and the antiferromagnetic layer 42 are deposited in this order from the bottom.

A seed layer for adjusting the crystal orientation may be installed between the antiferromagnetic layer 42 and the aluminum oxide layer 32.

The fixed magnetic layer 43 is magnetized/fixed (Pin direction), for example, in a Y2 direction by an exchange-coupling magnetic field (Hex) which is generated at an interface between the antiferromagnetic layer 42 and the fixed magnetic layer.

In FIG. 4, the fixed magnetic layer 43 is a single-layer structure such as CoFe or the like, but a laminate structure, in particular, a laminate ferri-structure formed with a magnetic layer/a nonmagnetic intermediate layer/a magnetic layer, is desirable to increase the force for fixing the magnetization of the fixed magnetic layer 43.

In addition, the free magnetic layer 45 shown in FIG. 4 is a single-layer structure, but it may be formed of a laminate structure of magnetic layers. It is desirable that the free magnetic layer 45 is formed of a single-layer structure of NiFe, or a laminate structure including NiFe.

The above-described multilayer film 41 includes the antiferromagnetic layer 42, but formation of the antiferromagnetic layer 42 is not necessary. The multilayer film 41 is a configuration having at least the fixed magnetic layer 43, the nonmagnetic conductive layer 44, and the free magnetic layer 45.

It is desirable that the multilayer film 41 shown in FIG. 4 is formed in a meandering shape, as shown in FIG. 3. The free magnetic layer 45 shown in FIG. 4 is appropriately aligned in the X1-X2 direction in a non-magnetic field state by a shape magnetic anisotropy which is caused by the meandering shape shown in FIG. 3. Accordingly, the fixed magnetic layer 43 and the free magnetic layer 45 are made orthogonal in their magnetizing relation in the non-magnetic field state. Alternatively, it can be controlled such that the magnetizing direction of the free magnetic layer 45 is aligned in the X1-X2 direction in the non-magnetic field state by using a hard bias layer (not illustrated). Electrode layers are installed at both sides of the multilayer film 41 formed in the meandering shape, and the electrode layers are electrically connected to the wiring patterns. With the above-described configuration, each of the wiring patterns can be formed in the same layer. For this reason, it is possible to easily form the respective wiring patterns. In this instance, the electrode layers and the wiring patterns may be separately formed, or may be integrally formed.

In this embodiment, the respective GMR elements R1 and R4 are formed by the same layer configuration, and the fixed magnetizing direction (Pin direction) of the fixed magnetic layer 43 is set in the same direction. In addition, in the GMR elements R1 and R4 shown in FIGS. 3 and 4, if the induced magnetic field A acts in the Y1 direction shown in FIGS. 1 and 2, the magnetization of the free magnetic layer 45 is directed in the direction opposite to the fixed magnetizing direction (Pin direction) of the fixed magnetic layer 43, so that the electric resistance value of the respective GMR elements R1 and R4 is also increased. Further, each of the GMR elements R1 and R4 is placed opposite to the first magnetic field generating portion 3 of the feedback coil 2 which acts in the same direction as the cancelling magnetic field B.

In this instance, the fixed resistance elements R3 and R4 are not resistance-changed by an external magnetic field. Accordingly, the output of the bridge circuit is altered based on the electric resistance change of the GMR elements R1 and R4.

As just described, the fixed magnetizing direction (Pin direction) of the fixed magnetic layer 43 of the respective GMR elements R1 and R4 is set in the same direction. With the GMR configuration, in order to change the output of the bridge circuit based on the electric resistance change of the GMR elements R1 and R4, it is necessary that one GMR element R1 is connected to the input terminal (Vdd) 10 side of one series circuit in the bridge circuit, and the other GMR element R4 is connected to the ground terminal (Vdd) 12 side of the other series circuit in the bridge circuit. In this embodiment, the respective wiring patterns are routed such that each of the wiring patterns is not intersected with the others by using the inside of the enclosed area S to form the bridge circuit wiring.

According to the wiring patterns in this embodiment, it is possible to appropriately measure the current to be measured by forming the respective GMR elements R1 and R4 in the same layer constitution and by setting the fixed magnetizing direction (Pin direction) of the fixed magnetic layer 43 in the same direction.

Accordingly, since the plurality of GMR elements R1 and R4 can be formed by the same process in this embodiment, it is possible to simplify a manufacturing process and to reduce a manufacturing cost. In addition, since the same GMR elements R1 and R4 can be formed, an electric resistance value and a temperature characteristic of the respective GMR elements R1 and R4 can be easily adjusted, thereby improving detection precision.

The configuration of the fixed resistance elements R2 and R3 is not limited to any particular one. For example, the conductive layer may be formed in a single-layer structure or a laminate structure. Alternatively, its resistance can be fixed by shifting the order of the layer configuration of the GMR elements R1 and R4. That is, in the GMR elements R1 and R4, the nonmagnetic conductive layer 44 is not interposed between the fixed magnetic layer 43 and the free magnetic layer 45, as shown in FIG. 4. However, the resistance can be fixed by a configuration in which in the fixed resistance elements R2 and R3, the antiferromagnetic layer 42, the fixed magnetic layer 43, the free magnetic layer 45, the nonmagnetic conductive layer 44, and the protective layer 46 are deposited in this order, and the nonmagnetic conductive layer 44 is interposed between the fixed magnetic layer 43 and the free magnetic layer 45. Accordingly, an electric resistance value and a temperature characteristic of the respective fixed resistance elements R2 and R3 can be appropriately and easily adjusted to the respective GMR elements R1 and R4.

In addition, as shown in FIG. 1, by placing the fixed resistance elements R2 and R3 opposite to each other under the second magnetic field generating portion 4 of the feedback coil 2, the respective resistance elements R1 to R4 can all be placed opposite each other under the feedback oil 2, the formation area of the respective resistance elements R1 to R4 can be decreased, thereby contributing to miniaturization. Further, since the fixed resistance elements R2 and R3 are placed opposite to the second magnetic field generating portion 4 of the feedback coil 2 on which the cancelling magnetic field acts in the same direction, the resistance of the fixed resistance elements R2 and R3 can be also changed in the same manner even in the configuration in which the fixed resistance elements R2 and R3 have the magnetic layer, and thus the resistance is slightly changed by an anisotropic magneto-resistance effect (AMR effect). As a result, it is possible to suppress the reduction in the detection precision.

It is desirable that the bridge circuit shown in FIG. 1 can achieve the detection precision at a high level in the non-magnetic field state (including the state in which the induced magnetic field A is cancelled by the cancelling magnetic field B) in a case where the outputs of the first output terminal 13 and the second output terminal 14 are midpoint potentials, and can alleviate the burden applied to the detection circuit side.

As shown in FIG. 1, the length of the respective wiring patterns is different in this embodiment. In addition, in this embodiment, in order to set it to the midpoint potential, a wiring pattern with a long length dimension is formed to have a wide width, and a wiring pattern with a short length dimension is formed to have a narrow width, such that the resistance value of the respective resistance elements R1 to R4 is consistent with that of the respective terminals 10 to 14.

As shown in FIG. 1, the wiring pattern 26 with the shortest length is formed to have the thinnest width, and the wiring pattern 27 with the longest length is formed to have the widest width.

The wiring pattern 20 is formed to have a thin width next to that of the wiring pattern 26. In addition, it is formed in a routing shape in which the distance from the input terminal 10 of the wiring pattern 20 to the GMR element R1 is identical to the distance from the input terminal 10 to the fixed resistance element R3.

In addition, the wiring patterns 22 and 24 are formed to have a width dimension which is a half that of the wiring pattern 20 and the wiring pattern 27. Further, the wiring pattern 22 is formed in a routing shape in which the distance from the first output terminal 13 to the GMR element R1 is identical to the distance from the first output terminal 13 to the fixed resistance element R2. Moreover, the wiring pattern 24 is formed in a routing shape in which the distance from the second output terminal 14 to the GMR element R4 is identical to the distance from the second output terminal 14 to the fixed resistance element R3.

Instead of the GMR elements R1 and R4, the TMR element shown in FIG. 5 can be used. In the TMR element, a portion of the non-magnetic conductive layer 44 is formed of an insulating barrier layer 47 such as Al—O or Ti—O.

In the configuration of the TMR element shown in FIG. 5, a lower electrode layer 49 is formed under a multilayer film 48, and an upper electrode layer 50 is formed on the multilayer film 48. In addition, as shown in FIG. 5, a hard bias layer 54 which is interposed between insulating layers 51 and 53 may be provided at both sides of the multilayer film 48.

The magnetizing direction of the free magnetic layer 45 can be appropriately arranged in the X direction perpendicular to the fixed magnetizing direction (Pin direction: Y1 direction) of the fixed magnetic layer 43 by the bias magnetic field generated from the hard bias layer 54.

In the TMR element shown in FIG. 5, a portion of the wiring pattern is electrically connected to the lower electrode layer 49, and a portion of the wiring pattern is electrically connected to the upper electrode layer 50. It is possible to integrally form the wiring pattern and the lower electrode layer 49, and the wiring pattern and the upper electrode layer 50.

In such a TMR element, since the electrode layers 49 and 50 are formed on and below the multiplayer film 48, the wiring patterns connected to the electrode layers 49 and 50 are formed in plural layers.

In this instance, an AMR element (anisotropic magneto-resistance effect element) can be used instead of the GMR elements R1 and R4.

The magnetic shield layer 36 shown in FIG. 2 can attenuate the induced magnetic field A, which is generated from the current I to be measured, applied to the GMR elements R1 and R4, and enhance the cancelling magnetic field B generated from the feedback coil 2.

In addition, although the plurality of GMR elements R1 and R4 is installed in FIG. 1, it is sufficient if there is one GMR element (magnetic detecting element).

It should be understood by those skilled in the art that various modifications, combinations, sub-combinations and alterations may occur depending on design requirements and other factors insofar as they are within the scope of the appended claims or the equivalents thereof.

What is claimed is:

1. A current sensor comprising:
   a magnetic detecting element, of which a resistance value is varied by application of an induced magnetic field from a current to be measured;
   a bridge circuit including a plurality of resistance elements having the magnetic detecting element, and connected to an input terminal, a ground terminal, and an output terminal; and
   a feedback coil placed adjacent to the magnetic detecting element, and generating a cancelling magnetic field for cancelling the induced magnetic field based on an output from the bridge circuit,
   wherein wiring patterns forming the bridge circuit are routed so as not to intersect with each other when seen in a plan view,
   one of the input terminal and the ground terminal is installed in a quantity of only one, and the other is installed in a quantity of two;
   only the resistance elements constituting each series circuit of the bridge circuit are connected to each other by the wiring pattern in an enclosed area which encloses each resistance element constituting the bridge circuit, and the wiring pattern branched from the wiring pattern is connected to the terminal which is installed in a quantity of only one, outside the enclosed area; and
   the wiring pattern connected to the terminals which are provided in a quantity of two, and the output terminal is installed outside the enclosed area.

2. The current sensor including the magnetic detecting element according to claim 1, wherein among the plurality of wiring patterns connected between each resistance element and each terminal, the wiring pattern with a short length dimension is formed to have a narrow width, and the wiring pattern with a long length dimension is formed to have a wide width.

3. The current sensor including the magnetic detecting element according to claim 1, wherein each magnetic detecting element is a magneto-resistance effect element exerting a magneto-resistance effect on an external magnetic field;
   the plurality of magnetic detecting elements is installed, in which each magnetic detecting element is placed opposite to a magnetic field generating portion of the feedback coil which generates the cancelling magnetic field in the same direction; and the fixed magnetic layer constituting each magnetic detecting element is magnetized/fixed in the same direction.

4. The current sensor including the magnetic detecting element according to claim 3, wherein the magnetic detecting element includes a multilayer film having at least a fixed magnetic layer, a nonmagnetic material layer, and a free magnetic layer which are deposited in this order, and an electrode layer connected to the wiring patterns to supply a current to the multilayer film.

5. The current sensor including the magnetic detecting element according to claim 4, wherein the electrode layer is placed at both sides of the multilayer film, and the wiring patterns are formed in the same layer.

6. The current sensor including the magnetic detecting element according to claim 4, wherein the electrode layer is placed on and below the multilayer film, and the wiring patterns are divided and formed in plural layers.

7. The current sensor including the magnetic detecting element according to claim 1, wherein each terminal is arranged in series, and only one input or ground terminal is placed at a center of the terminals.

8. The current sensor including the magnetic detecting element according to claim 1, wherein the resistance element has the magnetic detecting element and the fixed resistance element, and the magnetic detecting element and the fixed resistance element are placed opposite to the feedback coil.

* * * * *